United States Patent [19]
Kasai

[11] Patent Number: 5,760,688
[45] Date of Patent: Jun. 2, 1998

[54] BODY SENSING DEVICE

[75] Inventor: Eiji Kasai, Kyoto, Japan

[73] Assignee: Omron Corporation, Kyoto, Japan

[21] Appl. No.: 655,362

[22] Filed: May 24, 1996

[30] Foreign Application Priority Data

May 25, 1995 [JP] Japan ................ 7-125501
May 25, 1995 [JP] Japan ................ 7-126585

[51] Int. Cl.$^6$ ............................................ G08B 13/26
[52] U.S. Cl. .................. 340/561; 340/562; 340/565; 340/941
[58] Field of Search .................. 340/551, 552, 340/561, 562, 565, 567, 933, 941; 331/63, 64, 65, 107 R, 108 R, 117 R

[56] References Cited

U.S. PATENT DOCUMENTS

| | | | |
|---|---|---|---|
| 3,665,382 | 5/1972 | Siklos | 340/38 |
| 3,740,567 | 6/1973 | Atkins | 340/562 |
| 3,744,044 | 7/1973 | Vosteen | 340/554 |
| 3,761,908 | 9/1973 | Gehman | 340/258 |
| 3,764,861 | 10/1973 | Orris | 340/562 |
| 3,919,629 | 11/1975 | Scruggs | 327/463 |
| 4,015,236 | 3/1977 | Boudeville | 340/52 |
| 4,173,755 | 11/1979 | Butler | 340/562 |
| 4,380,721 | 4/1983 | Bullock et al. | 315/362 |
| 4,449,122 | 5/1984 | Whitmer | 340/562 |
| 4,942,372 | 7/1990 | Heimlicher | 331/65 |
| 5,227,764 | 7/1993 | Umemoto | 340/552 |
| 5,264,733 | 11/1993 | Tigges | 307/116 |

FOREIGN PATENT DOCUMENTS

| | | |
|---|---|---|
| 0 319 470 | 6/1989 | European Pat. Off. |
| 26 00 755 | 7/1976 | Germany. |

OTHER PUBLICATIONS

K. Mossbauer., "Inductive Proximity Switch", Elektor Electronics, Dec. 1992, vol. 18, No. 206, p. 67.

M Esguerra., "Ferrite Cores for Inductive Proximity Switches", Siemens Components, Nov./Dec. 1992, No. 6, pp. 19–20.

"Movement Detector", Elektor, Mar. 1981, pp. 330–333.

*Primary Examiner*—Brent A. Swarthout
*Assistant Examiner*—Van T. Trieu
*Attorney, Agent, or Firm*—Foley & Lardner

[57] ABSTRACT

An improved body sensing device capable of precisely sensing a living body at a standstill by discriminating the living body from other substances than the living body. An oscillator provided with a detection coil oscillates a high frequency signal. As there is no object or exists baggage or the like near the detection coil, the oscillator oscillates and generates a high frequency signal at a high level to be detected by a detector for turning on a transistor of a controller. As there exists a human body near the oscillator, the oscillation stops and the input signal from the detector to the transistor is extremely lowered, so that the transistor is turned off.

20 Claims, 17 Drawing Sheets

BODY SENSING DEVICE

BACKGROUND OF THE INVENTION

1. Field of the Invention

This invention relates to a body sensing device for sensing the presence or absence of a body, and more particularly to an improved living body sensing device capable of sensing the seating of a living body.

2. Discussion of the Related Art

Conventional sensing devices for sensing the presence or absence of a living body are a weight sensor for measuring the weight, an electrostatic capacity sensor utilizing an electrostatic capacity varying with the approach of the living body, a photo sensor for detecting the reflection or interruption by the living body, an infrared sensor, and an ultrasonic sensor.

The above-mentioned conventional sensors cannot discriminate the living body at a standstill from a piece of baggage. The weight sensor erroneously identifies heavy baggage seated on the sensor as a living body. The photo sensor erroneously identifies the presence of any object whenever light is interrupted by any material. The ultrasonic sensor erroneously identifies the presence of an object whenever the ultrasonic wave is reflected by any material. The infrared sensor has the disadvantage that the living body at a standstill is ignored.

An electrostatic capacitive sensor installed in a floor is conventionally used, but is sensitive to external conditions. If a foot separates from the floor, the sensor is erroneously operated. If a child sitting on a chair does not reach the floor, the child cannot be detected.

SUMMARY OF THE INVENTION

It is, therefore, a primary object of this invention to provide an improved body sensing device capable of precisely sensing a living body at a standstill by discriminating the living body from other substances than the living body.

According to a first aspect of this invention, there is provided a body sensing device including an oscillator for stopping the oscillation of a high frequency signal when a body to be detected thereby exists near a coil, and a controller for detecting the stop of the oscillation of the oscillator, the high frequency signal having such a frequency that the oscillator stops its oscillation in response to the approach by a non-magnetic body or a non-metallic body. In this device, the oscillator oscillates when no substance exists, but stops its oscillation when a non-magnetic body or a non-metal body exists near the device. The high frequency signal of the oscillator is designed to be between 10 MHz and 300 MHz. The coil is the size fitting to the body to be detected by the device, and employs an air-core coil having at least one turn. The coil may be modified to be wound around a magnetic member, and a plurality of coils connected to one another.

According to a second aspect of this invention, there is provided a living body sensing device including a coil for sensing a living body, a discriminating circuit connected with the coil for discriminating the approach of the living body, a circuit housing enclosing the discriminating circuit, in which the size of the coil in any horizontal directions is larger than that of the circuit housing in any horizontal directions. The coil is a one-turn coil fitting to a portion of the body in size, and particularly a circular air-core coil having a diameter between 15 centimeters and 30 centimeters. The coil is built within a seat or a cushion. The coil is made of good conductive materials in a high frequency. The discriminating circuit includes an oscillator for stopping its oscillation of a high frequency signal when a living body to be detected thereby exists near a coil, and a controller for detecting the stop of the oscillation of the oscillator. The oscillator is provided with a sensitivity adjuster for changing a quality factor of the coil. The oscillator also may be provided with a temperature compensation circuit for compensating the change of the level or frequency of the high frequency signal by temperatures.

According to a third aspect of this invention, there is provided a living body sensing device comprising an oscillator for generating a high frequency signal having a different level depending upon whether or not a living body exists near a coil, a detector for detecting an output signal generated from the oscillator, and a controller for discriminating the existence or absence of the living body in accordance with the magnitude of an output signal generated from the detector. The living body sensing device further includes a series circuit of a filter and an amplifier which is connected with the detector in parallel, in which any signal having a frequency higher than that of the high frequency signal upon the existence and absence of the living body near the coil is detected by the filter to be amplified by the amplifier and the level of the output signal generated from the detector is compensated by an output from the amplifier. The device may alternatively include an amplifier interposed between the detector and the controller and frequency detecting means for detecting the frequency of the output signal from the detector, in which an amplification factor of the amplifier is changed according to the frequency detected by the frequency detecting means.

According to a fourth aspect of this invention, there is provided a living body sensing device including an oscillator for generating a high frequency signal having a different level depending whether or not a living body exists near a coil, a detector for detecting an output signal generated from the oscillator to generate a detection signal, a controller for discriminating the existence or absence of the living body in accordance with the magnitude of the output signal generated from the detector, and frequency detecting means for detecting an output frequency of the oscillator, in which the controller determines the absence of the living body regardless of the level of the detection signal when the output frequency detected by the frequency detecting means is higher than the frequency upon the detection of the living body and non-detection of the living body and a body.

BRIEF DESCRIPTION OF THE DRAWINGS

Other objectives and advantages of this invention will be more readily apparent from the following detailed description provided in conjunction with the following figures, of which.

DETAILED DESCRIPTION OF THE INVENTION

Figure 1:
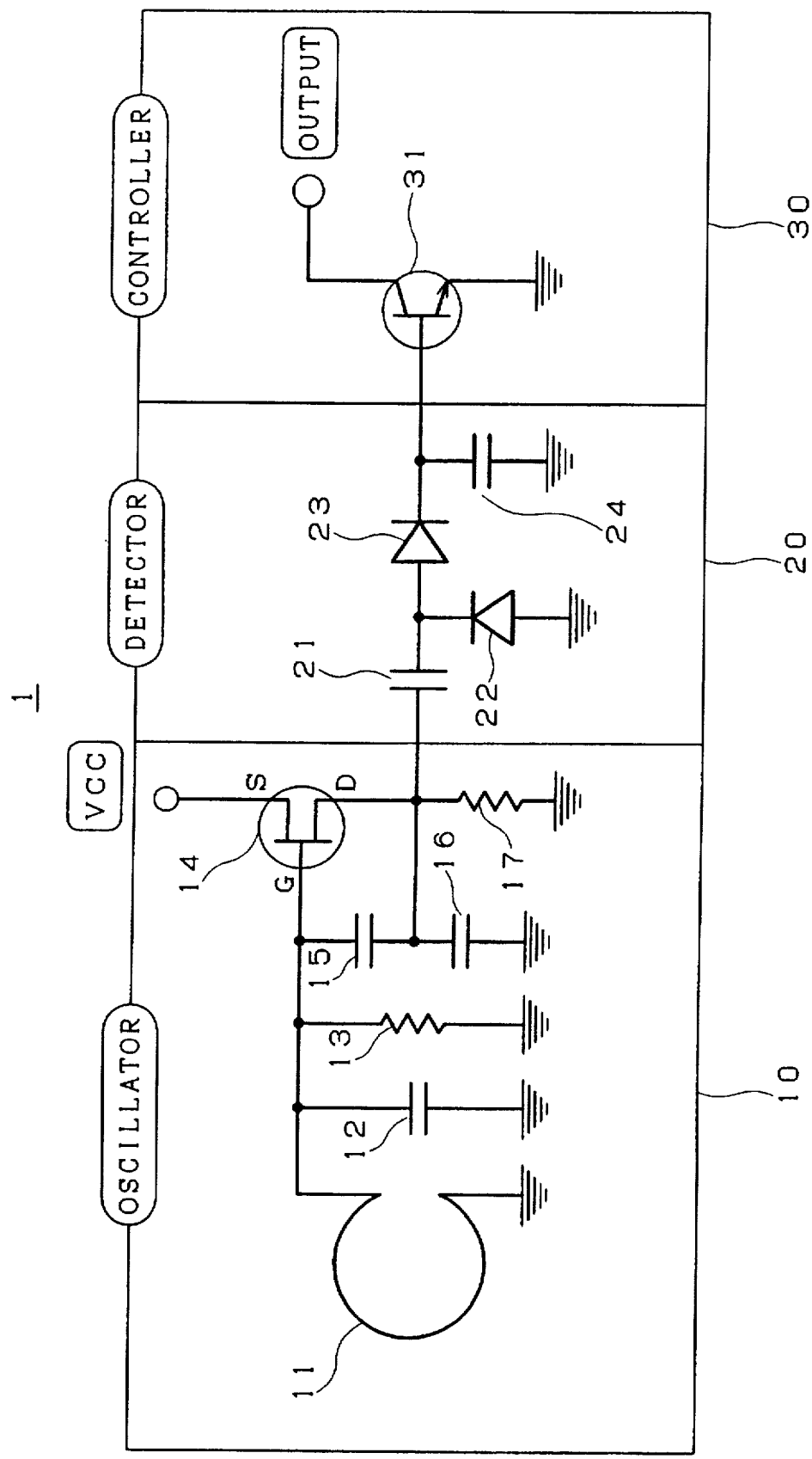
FIG. 1 is a schematic circuit diagram of a human body sensing device as a first embodiment of this invention.

Referring, now, to FIG. 1, there is shown a circuit diagram of a human body sensing device 1 as a living body sensing device according to a first embodiment of this invention, which includes an oscillator 10 for oscillating a high frequency signal, a detector 20 for detecting the high frequency signal from the oscillator 10, and a controller 30 for receiving a detected signal from the detector 20 to discriminate the existence or absence of a human body.

The oscillator 10 includes a detection coil 11, a capacitor 12 connected in parallel with the detection coil 11 and its one end is grounded, a resistor 13 connected in parallel with the capacitor 11, an FET 14 at its gate connected with one ends of these parallel connections, a series circuit of capacitors 15 and 16 connected between the gate of the FET 14 and the ground, and a resistor 17 connected in parallel with the capacitor 16. A connection point of the capacitors 15 and 16 is connected with a drain of the FET 14, and a source of the FET 14 is connected with a power source Vcc. The oscillator 10 employs a conventional Colpitts type LC oscillator. If desired, other oscillators such as a Hartley oscillator may be employed.

The oscillation frequency of the oscillator 10 is desirable to be 10 MHz or higher. When the detection coil 11 is a one turn coil, a diameter of a wire of the coil is 1.2 mm and a diameter of the coil is 200 mm. If desired, the diameter of the coil 11 may be between 150 mm and 300 mm. The capacitor 12 is 27 PF. The resistor 13 may be a variable resistor having a range from 10 KΩ to 150 KΩ for sensitivity adjustment so that the best sensitivity can be set to a human body existence. The capacitors 15 and 16 are respectively 47 PF. The resistor 17 is 470 Ω. These factors are one example, and may be changed according to a frequency for oscillation.

The detector 20 includes a capacitor 21 at one end thereof connected to the drain of the FET 14, a diode 22 at a cathode thereof connected with another end of the capacitor 21 and an anode thereof grounded, a diode 23 at an anode thereof connected with the another end, a capacitor 24 connected between a cathode of the diode 23 and the ground to generate a detection signal from a cathode of the diode 23.

The controller 30 includes an NPN-type transistor 31 at a base thereof for receiving the output signal from the detector 20, at an emitter thereof grounded and at a collector thereof for generating a signal representing the presence or absence of a human body.

Figure 2:
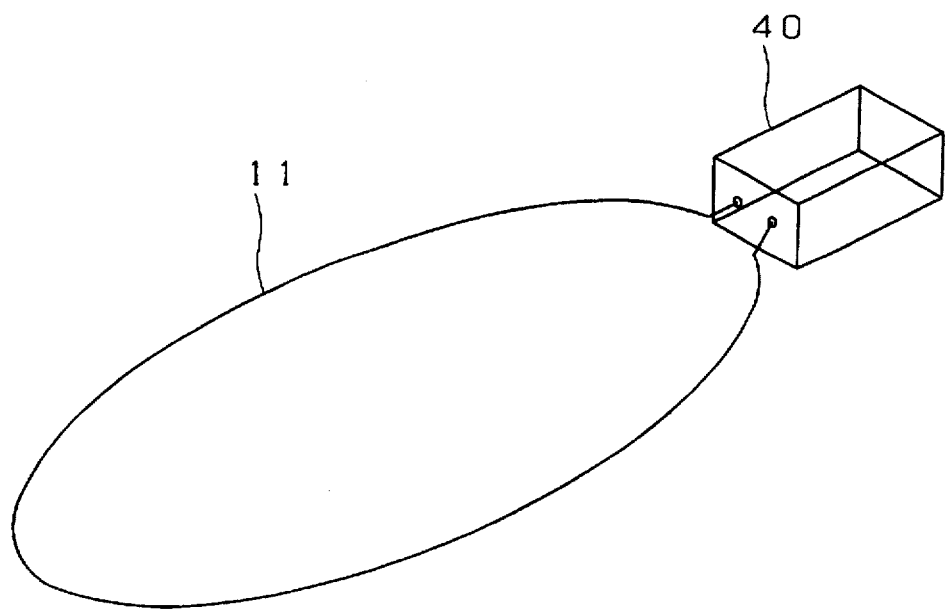
FIG. 2 is a perspective view of a detection coil employed in the sensing device of FIG. 1.
Figure 3:
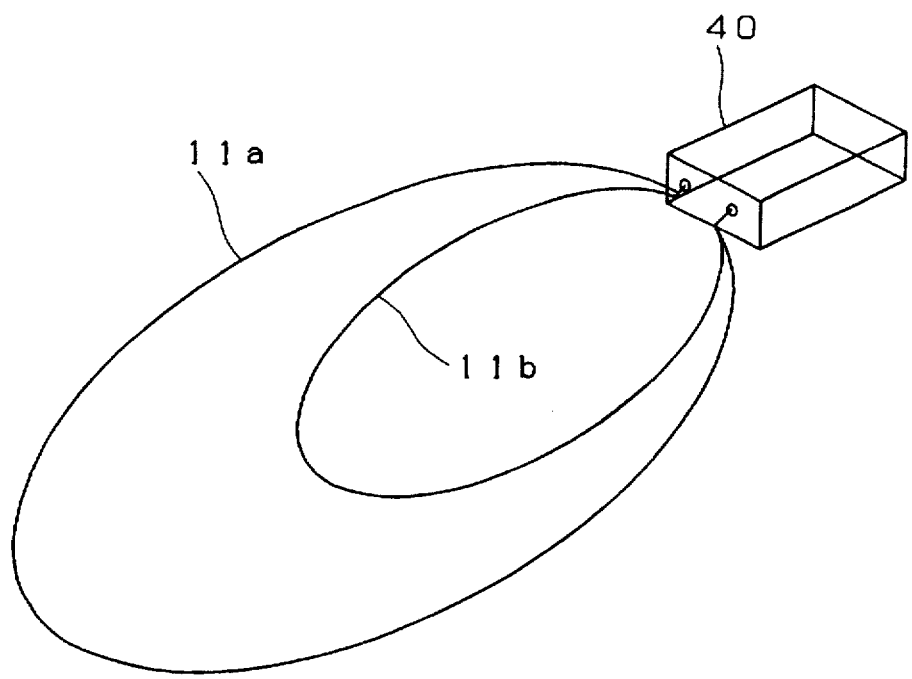
FIG. 3 is a perspective view of another detection coil which may be employed in the sensing device of FIG. 1 as a modification of the detection coil of FIG. 2.

As shown in FIG. 2, the detection coil 11 is a circular one-turn air-core coil having a diameter of 200 mm. The oscillator 10 other than the coil 11, the detector 20 and the controller 30 are housed within a circuit housing 40. If desired, the detection coil 11 may be modified to have a coil 11a having a diameter 200 mm and a coil 11b having a diameter 100 mm which are selectively used or connected in series as shown in FIG. 3, whereby diameters of the coils can be reduced in size.

Figure 4:
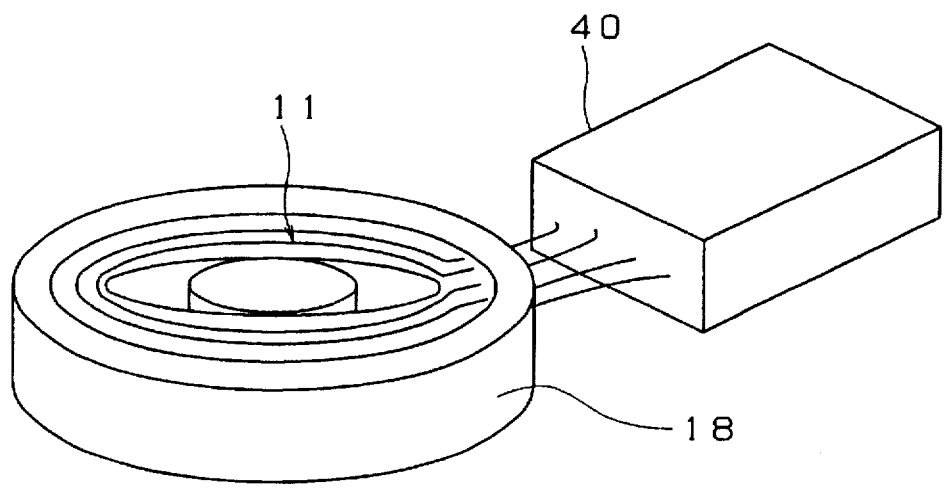
FIG. 4 is a perspective view of still another detection coil which may be employed in the sensing device of FIG. 1.

As a further modification, the detection coil 11 may be wound around a magnetic core 18 as shown in FIG. 4 so that a magnetic field can be generated only in one direction lying at right angles to a wall of the coil 11. The conductive wire of the detection coil 11 employs good conductive materials about a high frequency signal, such as Au (gold), Ag (silver), Cu (copper), Al (aluminum) and so forth. According to this modification, there is provided a compact detection coil capable of generating many magnetic lines of force to concentrate energy forward and of efficiently catching a change of permeability and displacement current.

Figure 6:
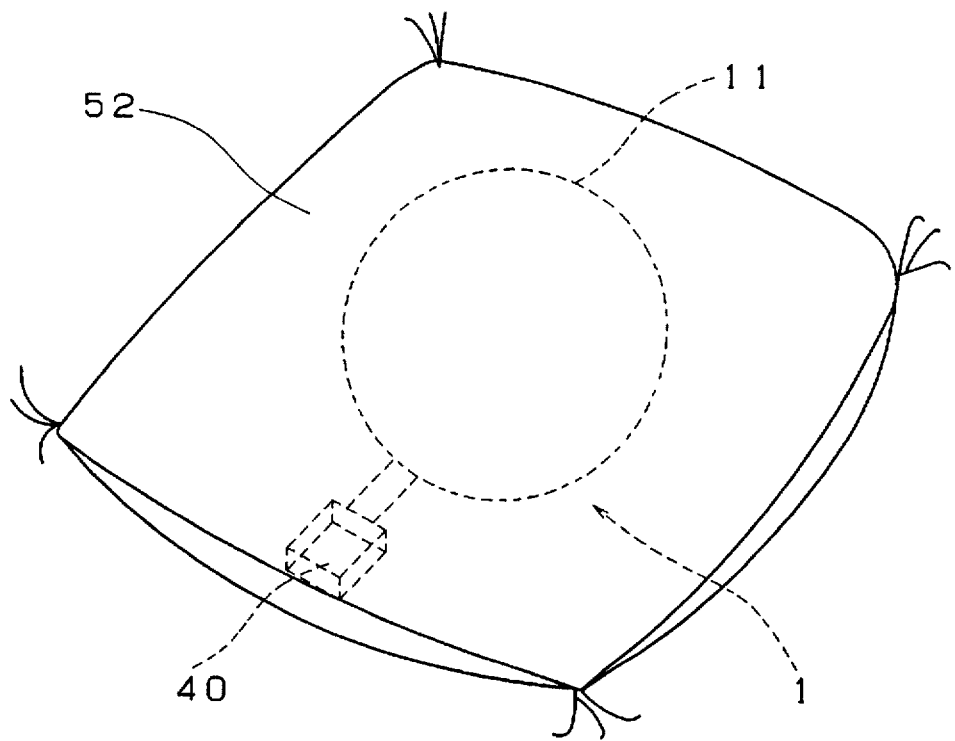
FIG. 6 is a perspective view of a cushion in which the human body sensing device is installed.
Figure 5:
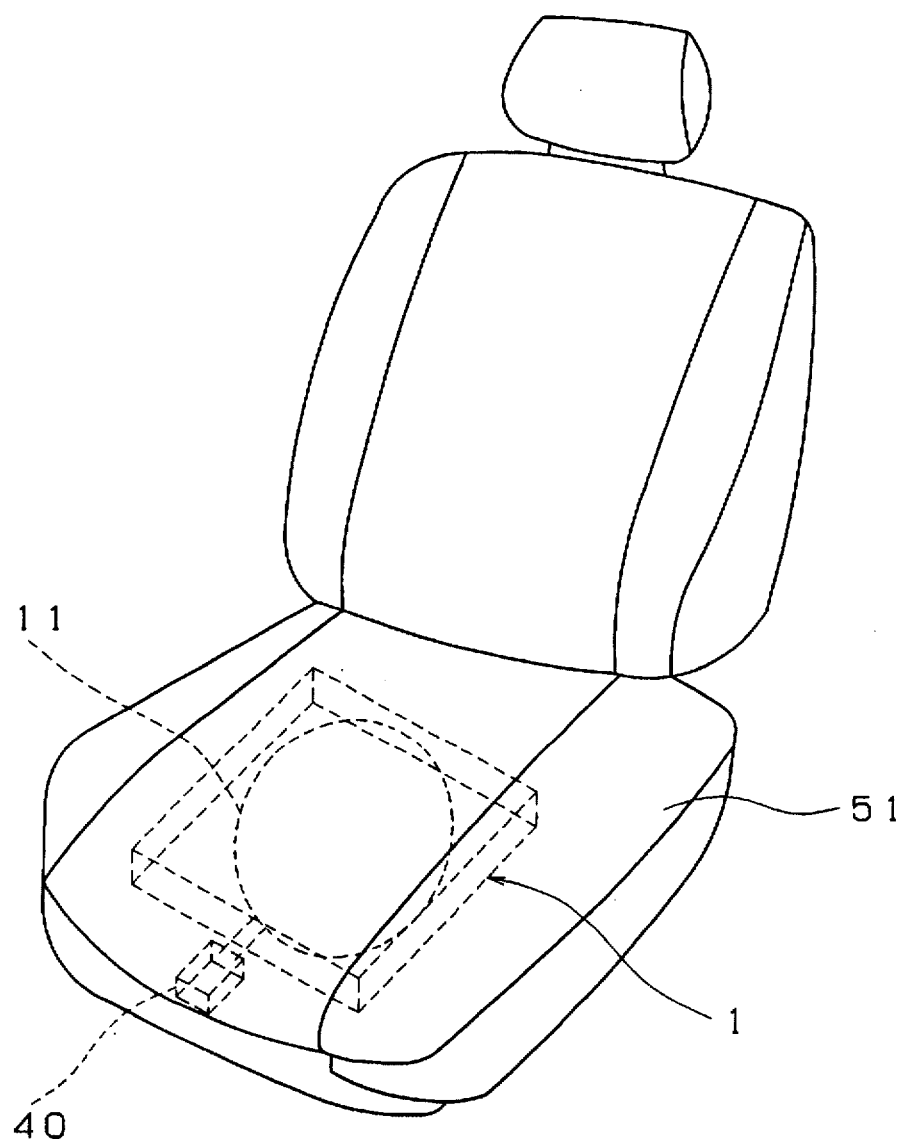
FIG. 5 is a perspective view of a seat in which the human body sensing device is installed.

The human body sensing device 1 of this embodiment may be buried within a bottom of a seat (in an automobile, a train, a theater and so forth) 51 as shown in FIG. 5 or within a seat cushion 52 as shown in FIG. 6. The device may be buried within other portions of a seat such as a support for the back of the seat. The cushion 52 enclosing the device is portable and it is useful for a driver to confirm the absence of a child on a rear seat in a car when the cushion is put on the rear seat.

Figure 7:
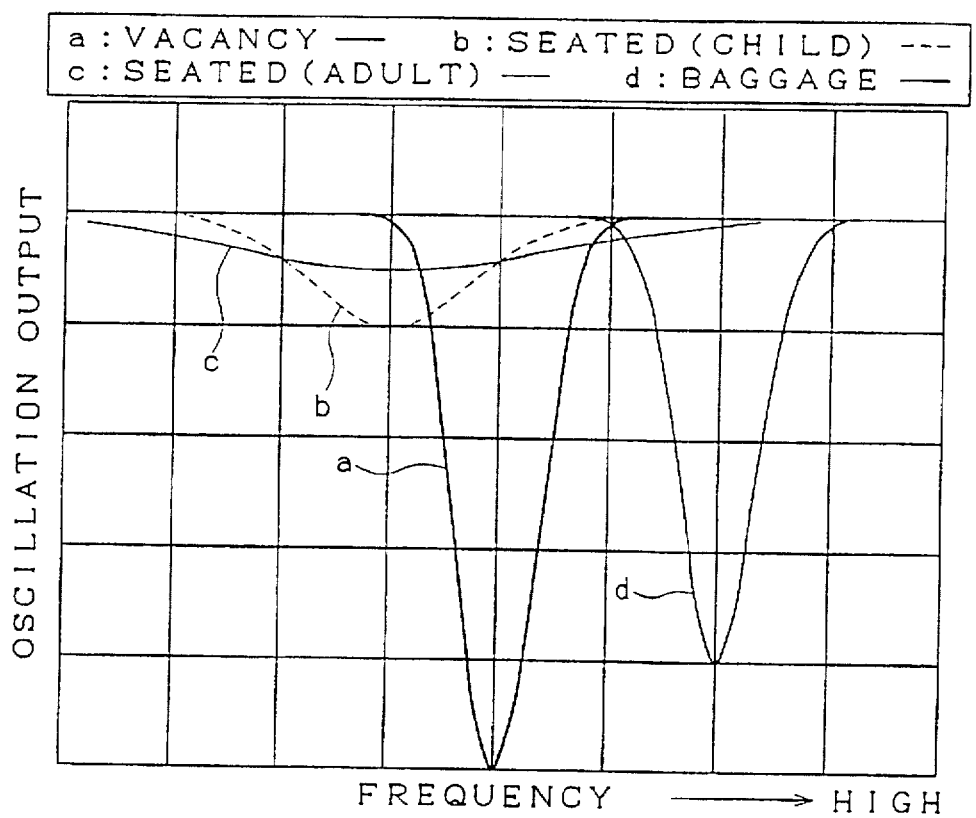
FIG. 7 is a graph showing relation between a frequency of an oscillator of the human body sensing device and a reflected wave when the seat is vacant, or seated by a child, an adult or baggage.
Figure 8:
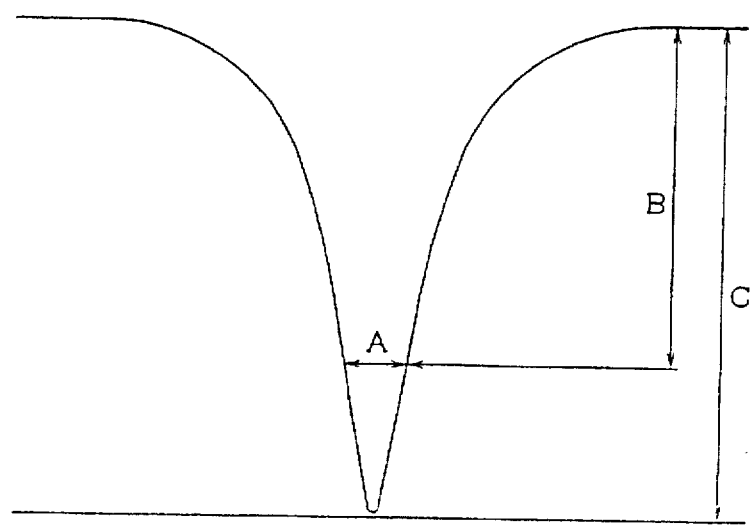
FIG. 8 shows illustration to find a quality factor in the characteristic curves of FIG. 7.

As the human body sensing device 1 is installed into the seat 51 of FIG. 5 or the cushion 52 of FIG. 6 and the oscillator 10 is activated, the characteristic of the oscillation output when the seat is vacant, seated by a child, seated by an adult and put by baggage is shown by curves "a", "b", "c" and "d" of FIG. 7. In the curve "a" of vacancy and the curve "d" of baggage, the quality factor "Q" is high. In the curves "b" and "c" of seating of the human body, the quality factor Q is small. As shown in FIG. 8, a reciprocal number of a value "A" in B/C=0.7 is proportional to a quality factor Q. Accordingly, if a quality factor Q in FIG. 7 is calculated, the factor Q is decreased in the order of "vacancy">"baggage">"child">"Adult". Upon setting a reference value of ON/OFF in the controller 30 between baggage and a child, the existence and absence of the seating of a human body can be discriminated.

Assuming that the seat 51 installed by the human body sensing device 1 is vacant or put by baggage other than the human body, the quality factor Q of the detection coil 11 is high and the oscillator 10 oscillates a high frequency signal (10 MHz). The high frequency signal generated from the oscillator 10 is detected by the detector 20 to be applied to the transistor 31, wherein an input level in the transistor 31 is high and the transistor is turned ON. This ON signal is outputed as a signal representing the absence of any human body. If the seat 51 is seated by a human body, the quality factor Q of the detection coil is reduced by the influence of permeability in the human body and the oscillator 10 stops its oscillation. Accordingly, the level of the high frequency signal applied to the detector 20 is also reduced to "0" and the detection signal from the detector 20 is low to turn OFF the transistor 31. This OFF signal is outputed as a signal representing the existence of the human body.

Figure 9:
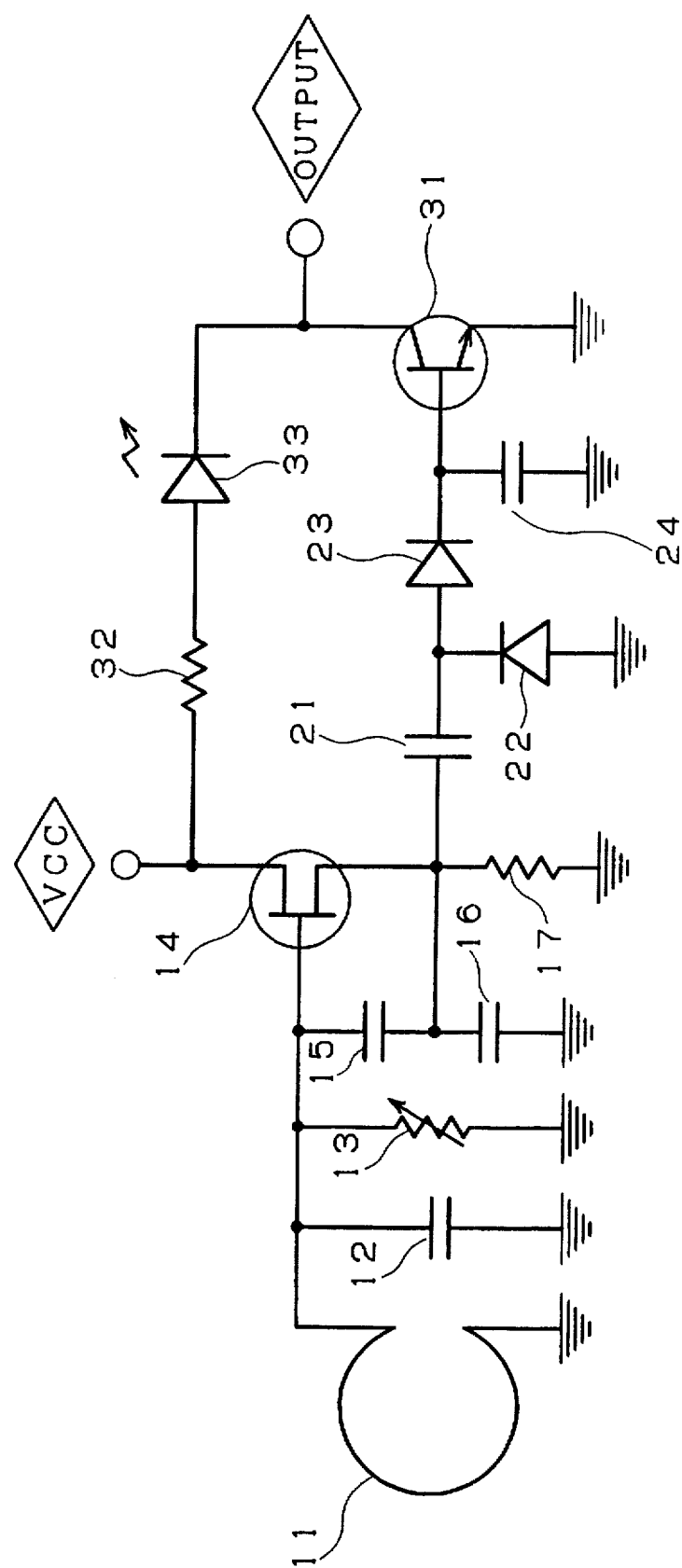
FIG. 9 is a schematic circuit diagram of a human body sensing device as a modification of the device of FIG. 1.

Thus, the controller 30 outputs the signal representing the existence and absence of a human body. If desired, as shown in FIG. 9, an operation display unit that includes a resistor 32 and a light emitting diode 33 may be interposed between a collector of the transistor 31 of the controller 30 and the source voltage Vcc. When the oscillator 10 oscillates due to vacancy or the existence of baggage, an electric current flows through the resistor 32 and the light emitting diode 33 to light the diode 33. Upon the seating by a human body at the seat 51, the oscillator 10 stops its oscillation, the transistor 31 is turned OFF, and the diode 33 is also turned off. Thus, according to this embodiment, a human body including a child at standstill can be precisely discriminated from baggage without contacting the human body and without influence by clothes of the human body and weight.

Figure 10:
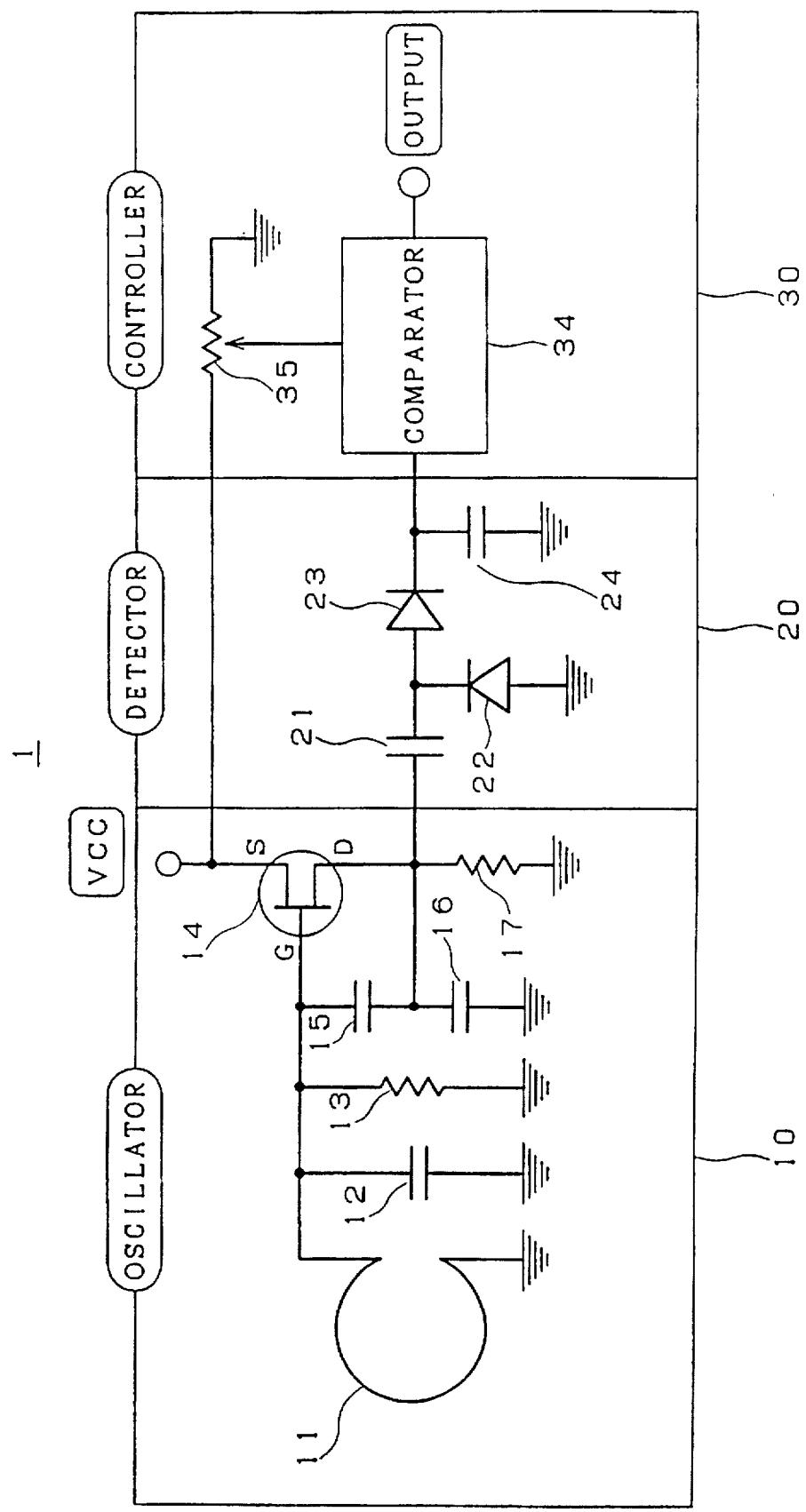
FIG. 10 is a schematic circuit diagram of a human body sensing device as a second embodiment of this invention.

FIG. 10 is a schematic circuit diagram of a human body sensing device 1 as a second embodiment of this invention, which includes an oscillator 10, a detector 20 and a controller 30. The oscillator 10 and the detector 20 have the same construction as those of the device 1 of FIG. 1. The controller 30 of FIG. 10 includes a comparator 34 and a reference voltage setting unit 35, which is different from the device 1 of FIG. 1. The comparator 34 compares the detection signal from the detector 20 with a reference voltage determined by the reference voltage setting unit 35 to generate a signal representing the absence of a human body when the detection signal is higher than the reference voltage and to generate a signal representing the existence of a human body when the detection signal is lower than the reference voltage.

The resistor 13 of FIGS. 1 and 10 may be modified to be a variable resistor having a resistance value which is varied with temperature sensed by a temperature sensor installed in the circuit housing 40 or the seat 51 or the like, so that the change of oscillation magnitude and frequency caused by the change of ambient temperature is reduced. If desired, temperature compensation may be employed by installing a temperature compensation element such as a thermistor into the oscillator 10.

Figure 11:
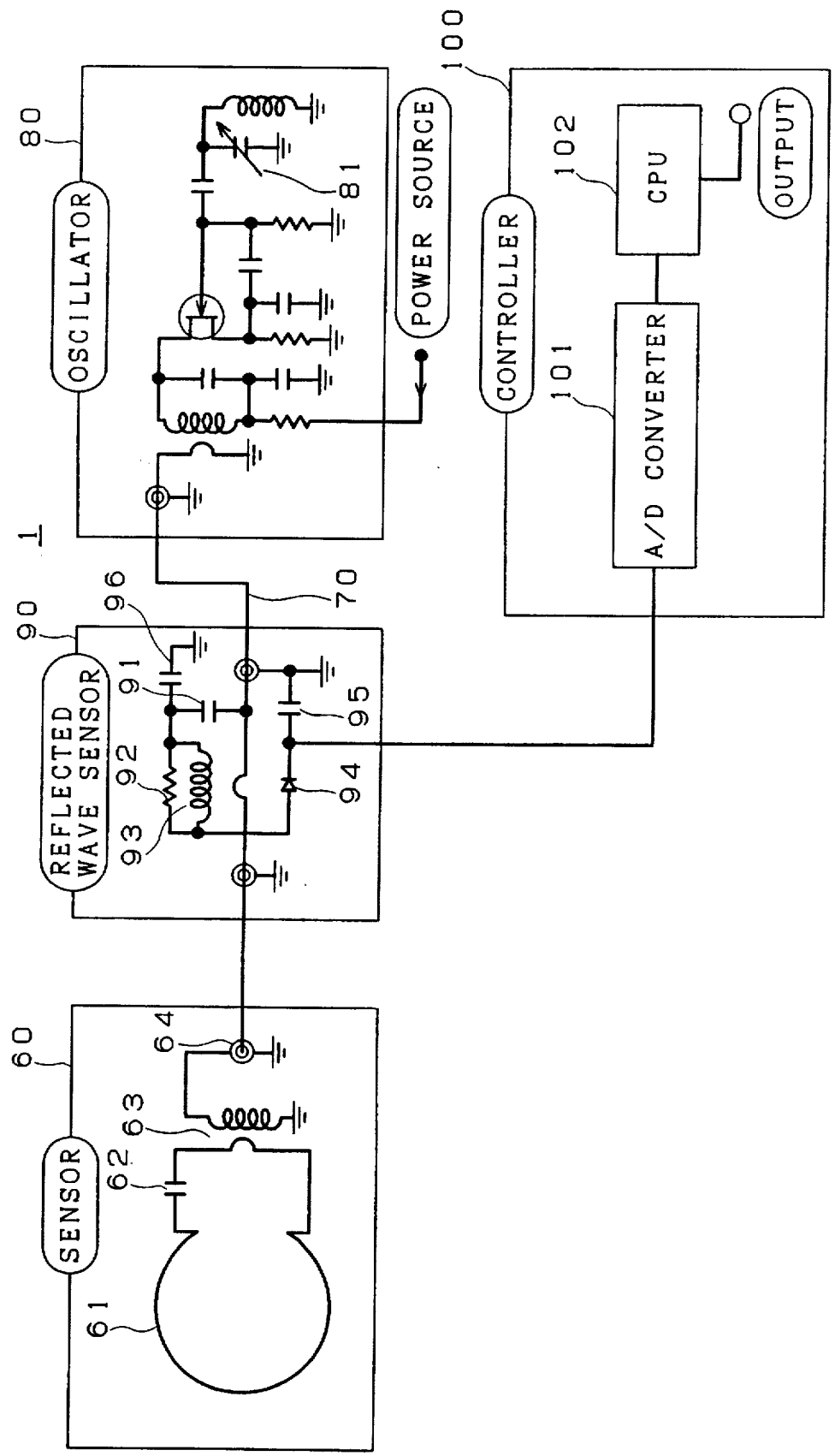
FIG. 11 is a schematic circuit diagram of a human body sensing device as a third embodiment of this invention.

FIG. 11 is a schematic circuit diagram of a human body sensing device 1 as a third embodiment of this invention, which includes a sensor 60, an oscillator 80 for transmitting a high frequency signal to the sensor 60 through a transmission path 70, a reflected wave sensor 90 detecting a reflection signal of the high frequency signal applied to the sensor 60 to be reflected by the same, and a controller 100 receiving the detected reflection signal for processing.

The sensor 60 includes a detection coil 61, a resonance capacitor 62 forming a series resonance circuit with the detection coil 61, and a real number transformer 63 in which a primary coil thereof is connected with the resonance circuit in an input side and a secondary coil thereof is connected with a high frequency input terminal 64 and a ground. The resonance circuit may employ a parallel resonance circuit if desired. The detection coil 61 may employ anyone of the coils of FIGS. 2, 3 and 4 and be installed in the seat or cushion of FIGS. 5 or 6.

The conductive wire of the detection coil 61 employs good conductive materials about a high frequency signal, such as Au (gold), Ag (silver), Cu (copper), Al (aluminum) and so forth. The good conductivity of the coil 61 provides an improved sensitivity and a reduction of a high frequency power loss.

The oscillator 80 employs an oscillation circuit of an LC resonance type, but may employ any conventional high frequency oscillation circuit, such as a crystal oscillator or a phase locked loop (PLL). The oscillator 80 includes a variable capacitor 81, in which the frequency of the high frequency signal generated from the oscillator 80 is scanned between 30 MHz and 50 MHz by automatically changing the capacity of the variable capacitor 81. A scanning mechanism for such scanning may be disposed in the oscillator 80, and changed by an instruction produced from the controller 100.

The reflected wave sensor 90 includes a capacitor 91 connected with the transmission path 70 and a parallel circuit that includes a resistor 92 and a coil 93 M-coupled with the transmission path 70. The parallel circuit at one end thereof is connected with the capacitor 31 and at another end thereof is connected with an anode of a diode 94. A cathode of the diode 94 is grounded through a capacitor 95 and externally generates an analog output signal. The reflected wave sensor 90 thus employs CM coupling, but may employ an MM coupling or other sensor if desired. A capacitor 96 is disposed to divide the signal from the sensor 60 for output, but may be omitted if desired. If so omitted, the signal is directly applied to the parallel circuit of the resistor 92 and the coil 93 through the capacitor 91.

The controller 100 includes an A/D converter 101 for converting an analog signal from the reflected wave sensor 90 into a digital signal, and a CPU 102 for logically processing the digital signal about the reflection wave level and frequency to execute a discrimination process such as vacancy, baggage, and the seating of a human body.

The human body sensing device 1 of this embodiment is buried within a bottom of a seat (in an automobile, a train, a theater and so forth) 51 as shown in FIG. 5 or within a seat cushion 52 as shown in FIG. 6. The device may be buried within other portions of the seat such as a support for the back of the seat.

In this human body sensing device 1 of this embodiment, the oscillator 80 oscillates a high frequency signal to be applied to the sensor 60 through the transmission path 70. As described above, the high frequency signal of the oscillator 80 is scanned in the range from 30 MHz to 50 MHz. The high frequency signal applied to the sensor 60 is reflected by the sensor 60. According to a substance positioned near the detection coil 61, the sensor 60 has a different impedance due to the difference of permeability or displacement current of the substance, so that the level of a reflected wave generated by a neighborhood, viz., an external circumstance, differs. This reflected wave is detected by the reflected wave sensor 90, and the controller 100 discriminates in view of the level and the frequency of the reflected wave as to whether the seat is vacant, put by baggage, or seated by a human body.

Figure 12:
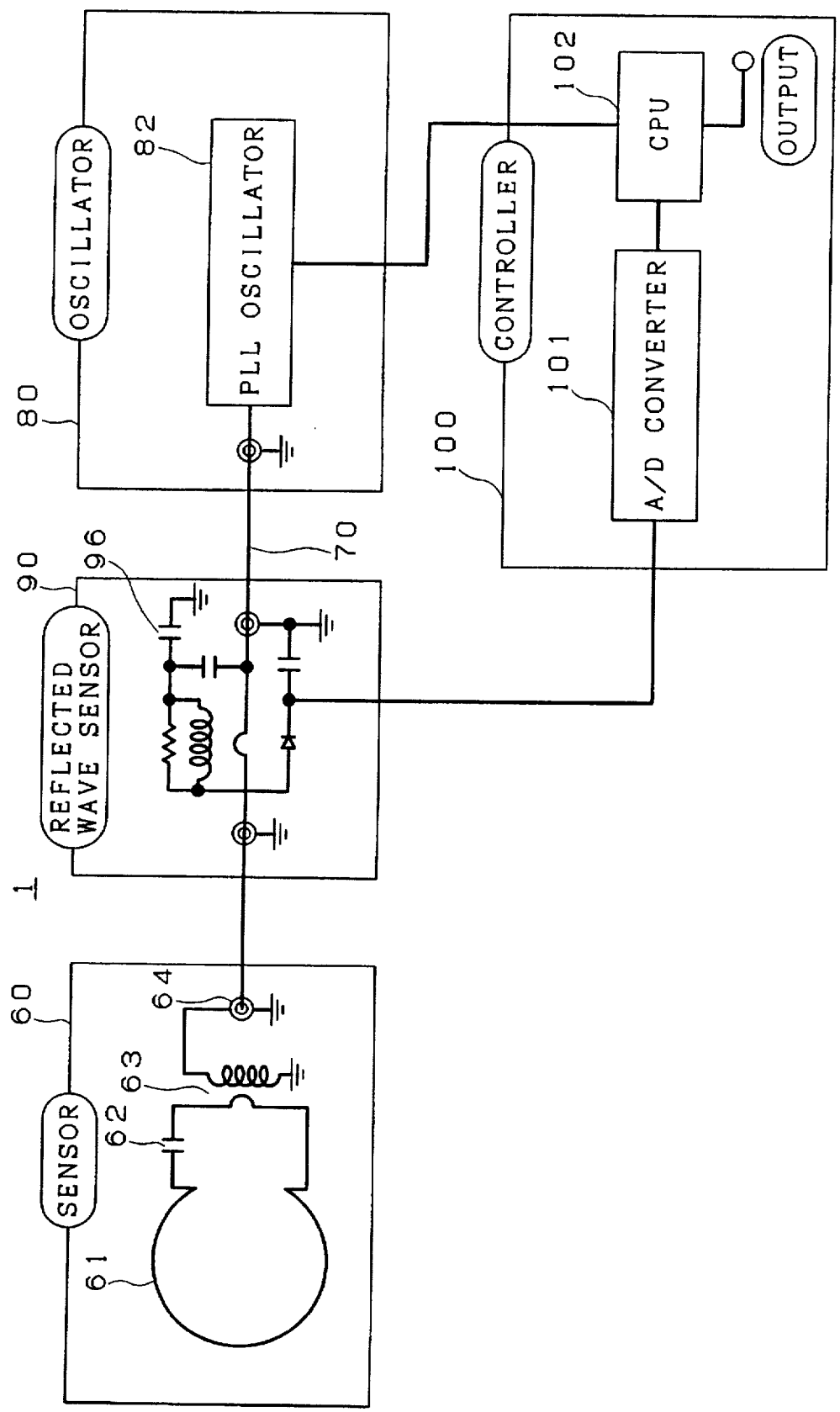
FIG. 12 is a schematic circuit diagram of a human body sensing device as a fourth embodiment of this invention.

FIG. 12 is a schematic circuit diagram of a human body sensing device 1 as a fourth embodiment of this invention. The device 1 includes a sensor 60 and a reflected wave sensor 90 which have same components as those of the device of FIG. 11, and a PLL oscillator 82 different from the device of FIG. 11. The oscillator 80 changes its high oscillation frequency in accordance with an instruction from a CPU 102 of the controller 100.

Figure 13:
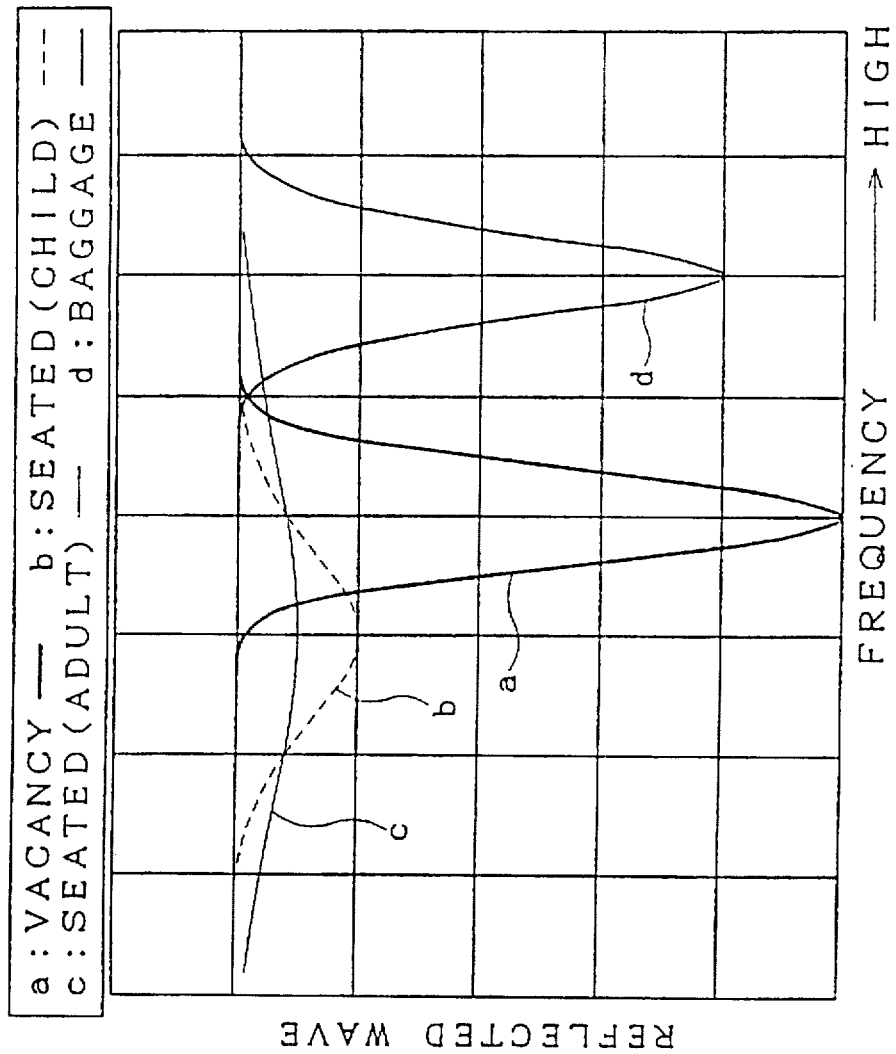
FIG. 13 is a graph showing the relation between a frequency of an oscillator of the human body sensing device of FIG. 12 and a reflected wave when the seat is vacant, or seated by a child, an adult or baggage.

As the human body sensing device 1 of FIG. 11 or 12 is installed into the seat 51 of FIG. 5 or the cushion 52 of FIG. 6 and the oscillator 80 is activated, the characteristic of the oscillation output when the seat is vacant, seated by a child, seated by an adult and put by baggage is shown by curves "a", "b", "c" and "d" of FIG. 13. In the curve "a" of vacancy and the curve "d" of baggage, the reflected wave is very small at a frequency and the quality factor "Q" is high. In the curves "b" and "c" of seating of the human body, the reflected wave is small at a frequency but its change is small, and the quality factor Q is small. The difference of the frequency characteristic of thus reflected waves is made by the difference of the permeability and displacement current when the seat is vacant (air), put by baggage and seated by a human body.

Figure 14:
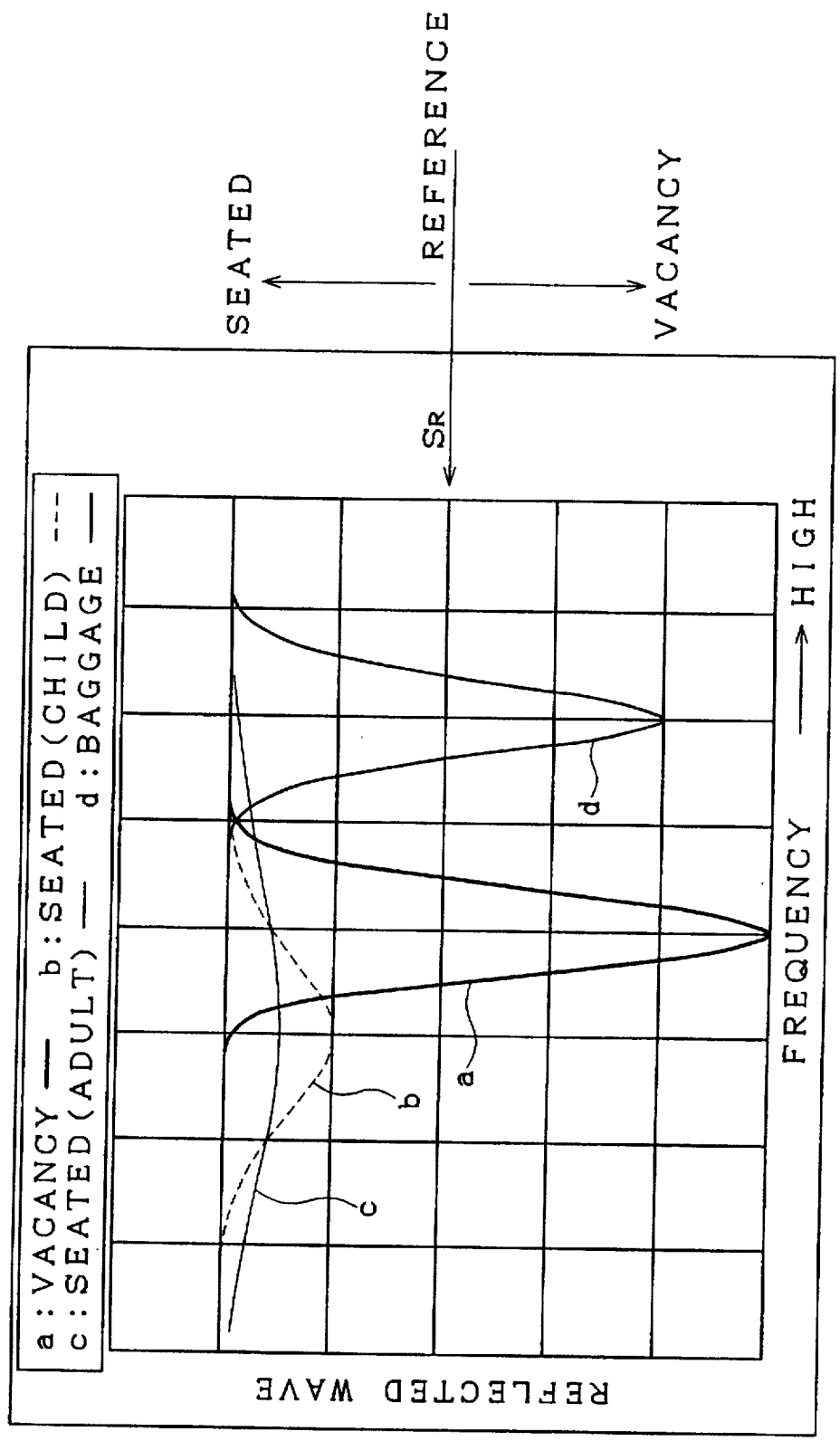
FIG. 14 is a graph of frequency vs. reflected wave characteristic to explain a detection operation about the human body by the sensing device of FIG. 11 or 12.

If the level of the reflected wave detected by the reflected wave sensor 13 is larger than a reference value $S_R$ over a whole frequency range as shown in FIG. 14, it means that the human body is seated. If there is a frequency where the level of a reflected wave is lower than the reference value $S_R$, it means that the seat is vacant or put by baggage. The CPU 102 of the controller 100 discriminates between the human body, vacancy and baggage.

Figure 15:
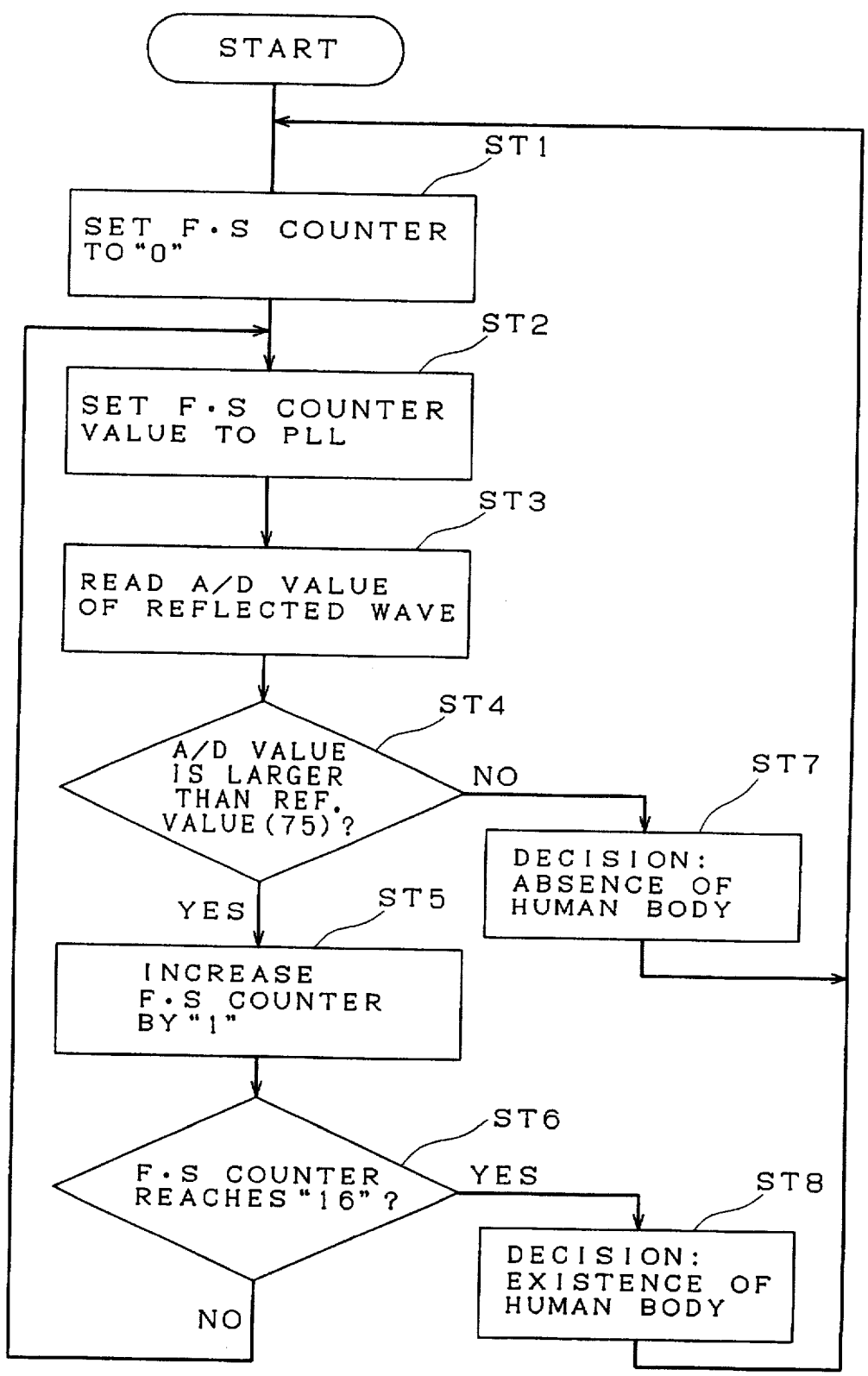
FIG. 15 is a flow chart to show an seating detection operation by the human body sensing device of FIG. 12.

In FIG. 15, there is shown a flow chart to show a detection operation in the human body sensing device 1 of FIG. 12.

In the CPU 102 a frequency setting counter is set to "0" (step ST1). Then a count value of the frequency setting counter is set to the PLL oscillator 82 of the oscillator 80 (step ST2). In this state the oscillator 80 oscillates a high frequency signal of a frequency corresponding to the set value. This high frequency signal is applied to the sensor 60 through the transmission path 70, and a reflection signal according to an external state is detected by the reflected wave sensor 90. The CPU 102 reads the A/D converted value of the reflection wave through the A/D converter 101 (step ST3).

It is inquired if the read A/D value of the reflected wave is a reference value (75) or larger (step ST4). If the read A/D value is the reference value or larger, the frequency setting counter is increased by "1" (step ST5) and it is inquired whether or not the counted value of the frequency setting counter reaches "16" (step ST6). At first the counted value does not reach "16" and the sequence returns to the step ST2, where the counted value of the frequency setting counter increased by "1" is set to the PLL oscillator 82 and the oscillator 80 oscillates at a frequency corresponding to the new counted value. The sequence from the step ST2 to the step ST6 is repeated likewise.

If the A/D value is smaller than the reference value (75) before the counted value of the frequency setting counter becomes 16, a NO response is generated at the step ST4. As shown in FIG. 9 this means that the level of the reflected value is smaller than the reference value $S_R$ at a frequency and the factor Q is high. Accordingly it is decided that the seat is vacant or put by baggage and that there is not the human body (step ST7). As the counted value of the frequency setting counter becomes "16", one time scanning of frequency change is completed. Unless there is any reflected wave having an A/D value smaller than the reference value at this time point, this means in FIG. 9 that the level of the reflected wave is the reference value $S_R$ or larger over the scanning frequency range. Accordingly, as the counted value of the frequency setting counter becomes "16" at the step ST6, a YES response is generated and the presence of the human body is judged (step ST8).

Figure 16:
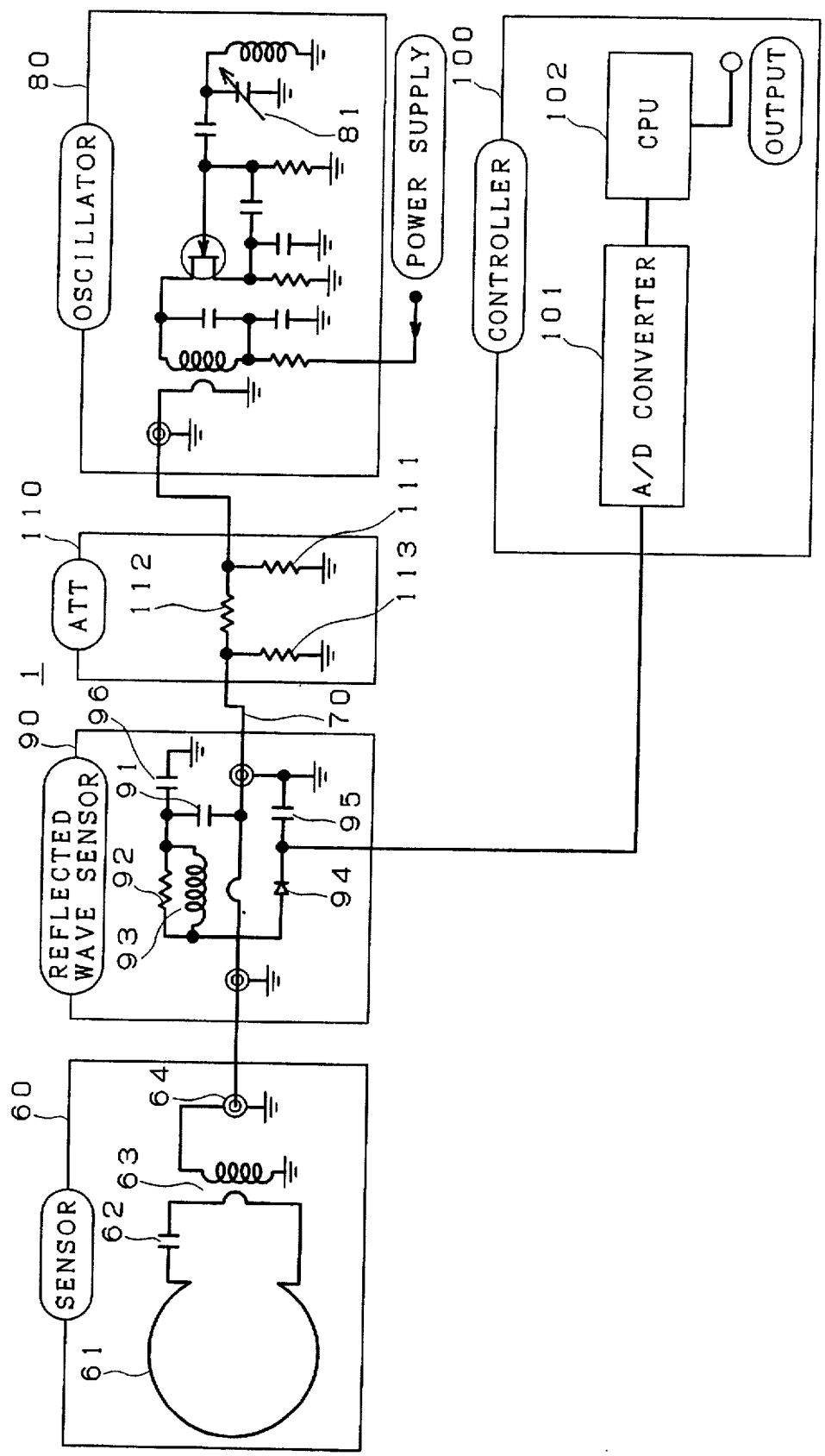
FIG. 16 is a schematic circuit diagram of a human body sensing device as a fifth embodiment of this invention.

FIG. 16 shows a circuit diagram of a human body sensing device as a fifth embodiment of this invention, which includes an attenuator 110 additionally interposed between the oscillator 80 and the reflected wave sensor 90 of FIG. 11. The attenuator 110 employs a π type circuit that includes resistors 111, 112 and 113, but may employ other type of circuits.

As the impedance of the sensor 60 largely varies with a substance to be measured, the signal from the reflected wave sensor 90 increases. In this time point the load impedance of the oscillator 80 and the input impedance of the sensor 60 are not matched and the operation of the oscillator 80 is unstable. To prevent this unstable operation, the attenuator 110 is disposed at an output side of the oscillator 80 and a part of the output of the oscillator 80 is always consumed by the resistors. Even if the impedance largely varies and matching is not obtained, the oscillator 80 safely operates by stabilizing the load impedance of the oscillator 80.

Though the level of the reflected wave is detected by the reflected wave sensor 90 in the above-mentioned embodiments of FIGS. 11, 12, and 16, a standing-wave ratio (SWR) may be measured. As a modification of these embodiments, the sensing devices may be so designed that the high frequency signal generated from the oscillator is applied to the sensor through the transmission path and a phase shift against the high frequency signal transmitted in the detector from the transmission path is detected. As another modification, the sensing device may be so designed that the high frequency signal generated in the oscillator is supplied to the sensor including a resonance circuit through a transmission path and a voltage or a current in the sensor is detected according to the external status such as vacancy, baggage, the human body or the like to detect a body. The human body sensing devices of the foregoing embodiments are designed to identify vacancy, baggage and the human body as a human body sensor, but may be applied to a substance sensor for sensing substances other than baggage.

Figure 17:
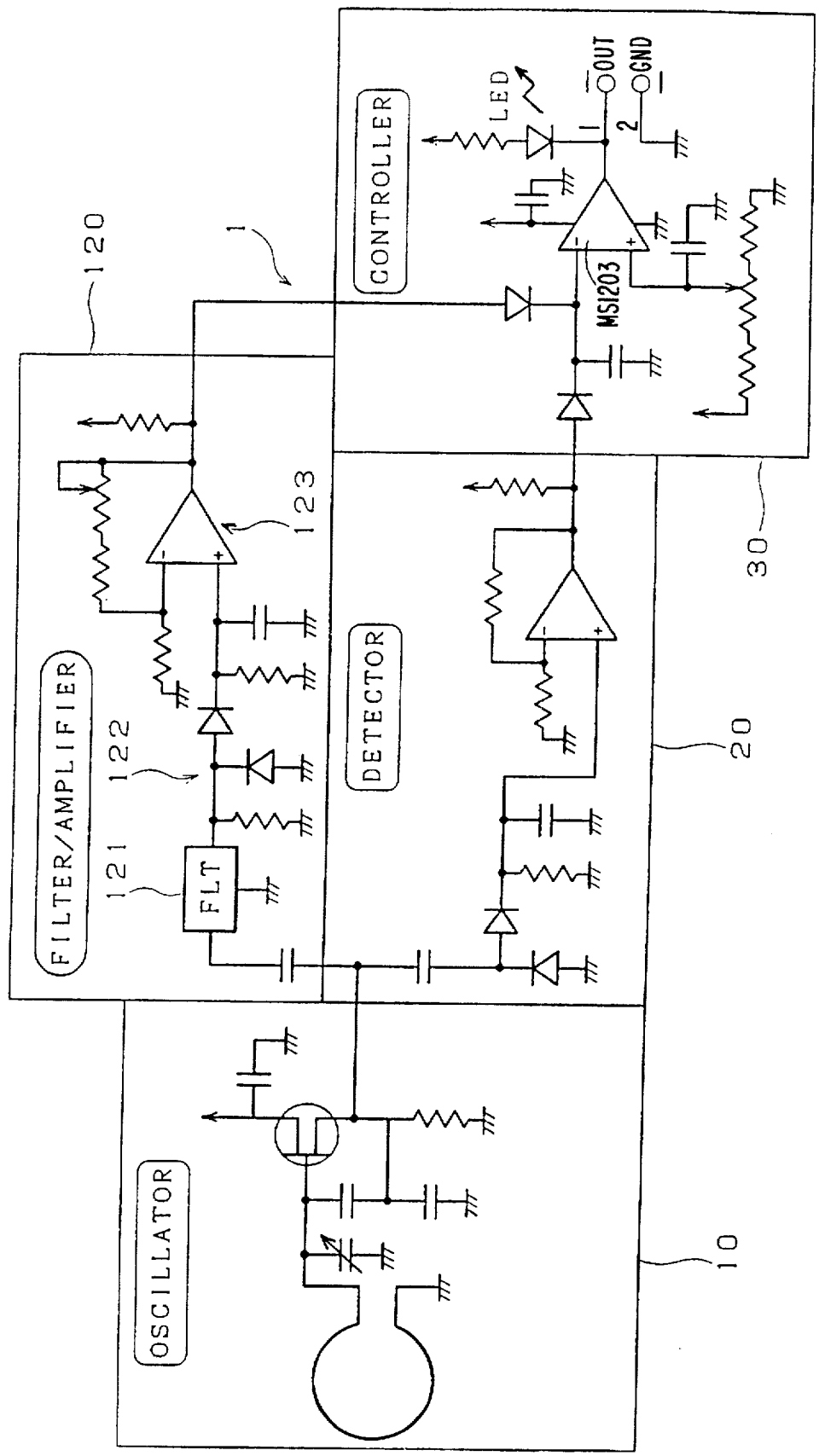
FIG. 17 is a schematic circuit diagram of a human body sensing device as a sixth embodiment of this invention.
Figure 18:
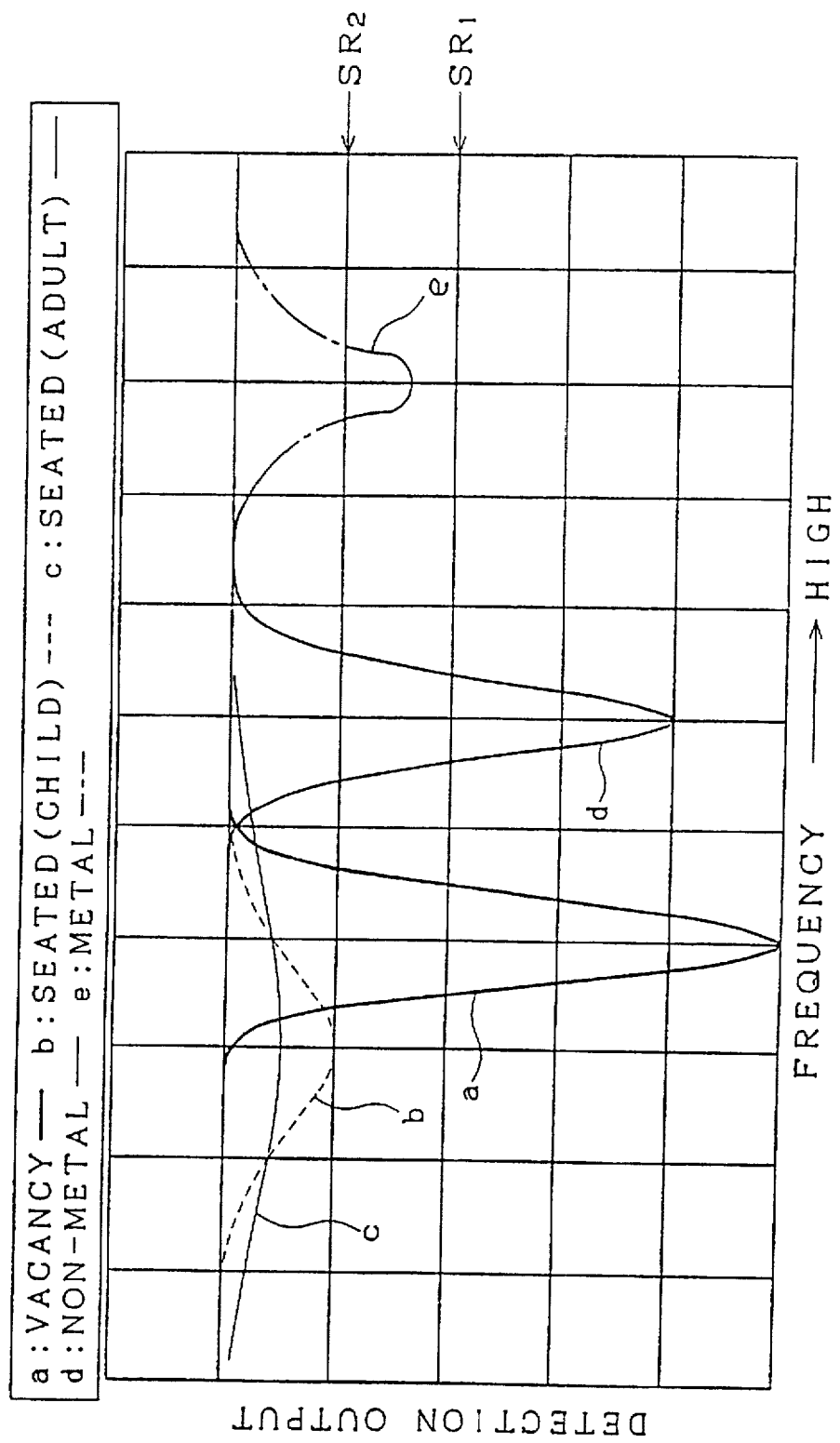
FIG. 18 is a graph explaining an erroneous operation in the human body sensing device.

FIG. 17 is a schematic circuit diagram of a human body sensing device 1 as a sixth embodiment of this invention. The device 1 includes an oscillator 10, a detector 20, and a controller 30. The sensing devices 1 of FIGS. 1 and 10 for discriminating a human body and other body is prone to erroneously detect a metal body as a human body because a metal body provides a level similar to the levels of non-metal and a human body as shown in FIG. 18.

The human body sensing device 1 of FIG. 17 is so designed to prevent any erroneous operation about a metal plate by reviewing a frequency of an oscillation frequency about a metal body. For this purpose, the device 1 of this embodiment further includes a filter circuit 120. The circuit 120 includes a high frequency filter 121 for receiving an output from the oscillator 10, a detector circuit 122 for detecting the output from the filter 121, and an amplifier 123 for amplifying the detection output from the detector circuit 122.

As a human body sits on a seat, the oscillation output from the oscillator 10 becomes small, and is detected by the detector 20 to be applied to the controller 30. The level of a signal applied to the controller 30 is smaller than a reference value $SR_1$ as shown in FIG. 18 and the controller 30 generates a human body existence signal. In the case of a human body and a non-metal body, the oscillation frequency of the oscillator 10 is low and cut by the high frequency filter 121. As a metal body is put on the seat, the output of the oscillation of the oscillator 10 is decreased. The frequency about the metal body is higher than those of human body and non-metal body as shown in FIG. 18. Only a high frequency component of the output from the oscillator 10 is passed by the high frequency filter 121, detected by the detector 122, and amplified to a predetermined level by the amplifier 123. This amplified output signal is applied to the controller 30. Since the amplified output signal is so amplified by the amplifier 123 to be larger than a reference value $SR_1$, the controller 30 does not decide the existence of a human body. Accordingly, any metal body is not erroneously discriminated as a human body.

Figure 19:
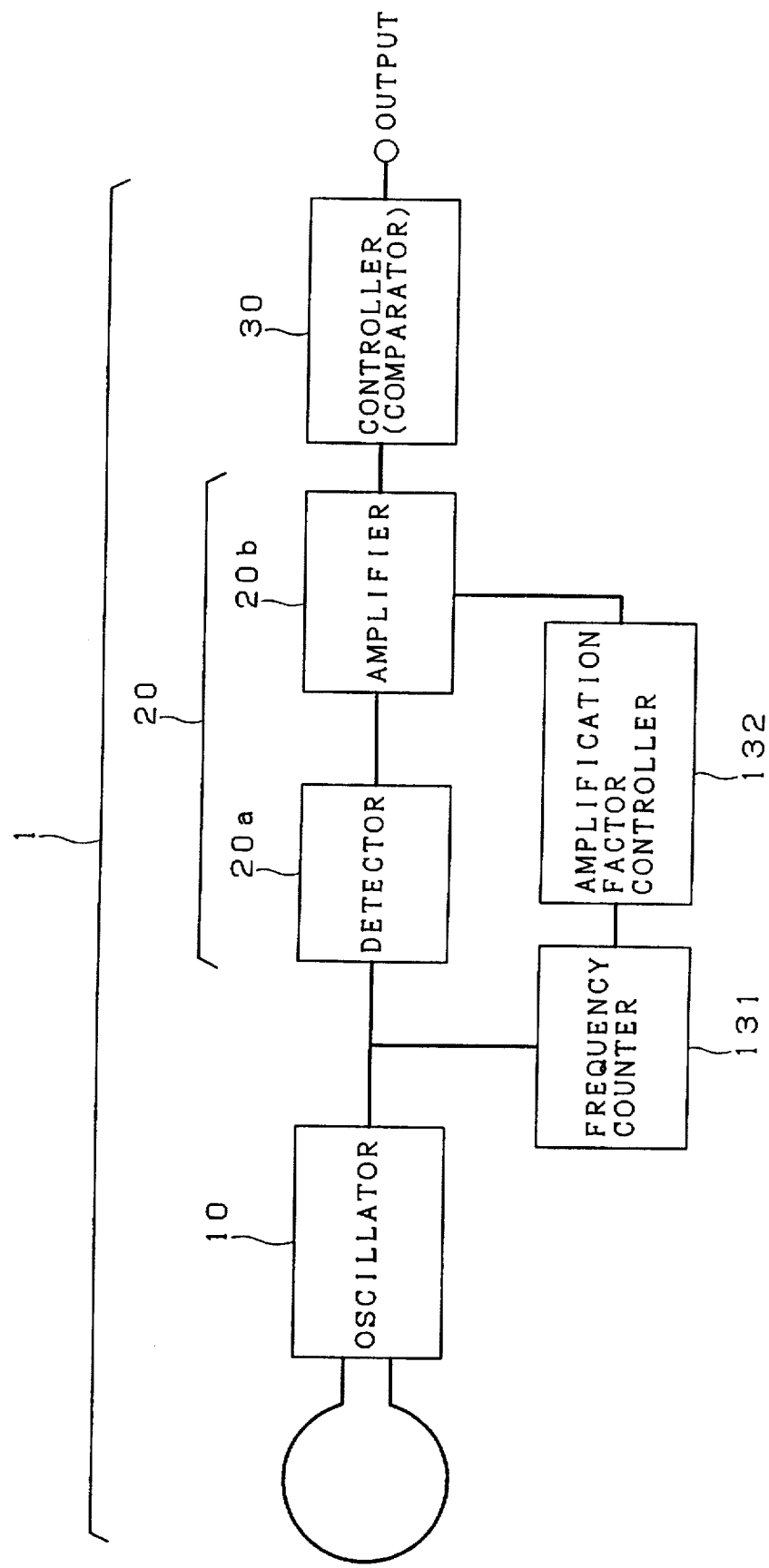
FIG. 19 is a schematic block diagram of a human body sensing device as a seventh embodiment of this invention.

FIG. 19 is a schematic block diagram of a human body sensing device 1 as a seventh embodiment of this invention, which does not erroneously detect a metal body as a human body. The device 1 includes an oscillator 10, a detector 20 and a controller 30, which are similar to those of FIG. 17, but further includes a frequency counter 131 for counting the output from the oscillator 10 and an amplification factor controller 132 for controlling an amplification factor of the amplifier 20b according to the frequency. This human body sensing device 1 discriminates a human body and a non-metal body in the same way as those of the above-mentioned devices. As a metal body is positioned near a coil connected with the oscillator 10, the oscillation frequency of the oscillator 10 becomes high. The oscillation output of the high frequency is counted by a frequency counter 131. As the frequency becomes higher, the gain of the amplifier 20b is increased. The level of the oscillation output of the oscillator 10 is lowered by the existence of the metal body, but increased by the amplifier 20b to be applied to the controller 30 with a high level similar to that of a non-metal body. Thus, any metal body is not erroneously detected as a human body.

Figure 20:
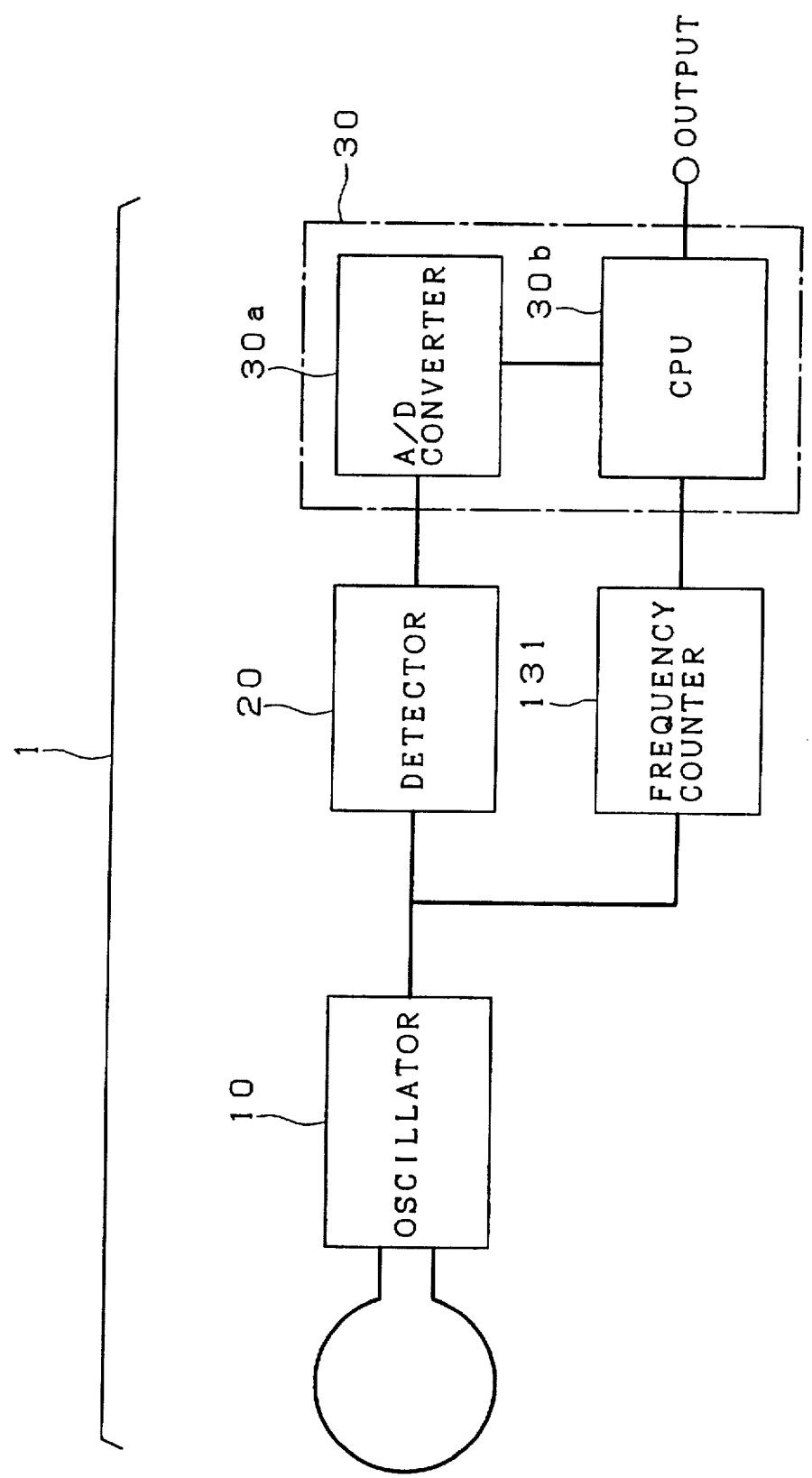
FIG. 20 is a schematic block diagram of a human body sensing device as an eighth embodiment of this invention.

FIG. 20 is a schematic block diagram of a human body sensing device 1 as an eighth embodiment of this invention, which does not erroneously detect a metal body as a human body. The device 1 also includes an oscillator 10, a detector 20 and a controller 30. It further includes a frequency counter 131 for counting the output from the oscillator 10. The controller 30 includes an A/D converter 30a for converting an output generated from the detector 20 into digital values and a CPU 30b.

In the human body sensing device 1 of FIG. 20, the oscillation output from the oscillator 10 is lowered when a human body exists near a detection coil of the device 1. The oscillation output is detected by the detector 20 to be applied to the CPU 30b through the A/D converter 30a. The oscillation output from the oscillator 10 is not lowered when a non-metal body exists near the detection coil of the device 1, and detected by the detector 20 to be applied to the CPU 30b through the A/D converter 30a. As a metal body is positioned near the oscillator 10, the oscillation output of the oscillator 10 occurs but its oscillation frequency becomes high. A count value representing a high frequency is applied to the CPU 30b by frequency count of the frequency counter 131, and the CPU 30b reduces the reference value like $SR_2$ of FIG. 18. The signal level taken in through the detector 20 and the A/D converter 30a is reduced, but is still high because the reference value is lowered to $SR_2$. Thus, the CPU 30b does not discriminate as a human body and generate any signal representing the existence of a human body. Thus, any metal body is not erroneously detected as a human body.

While the invention has been described and illustrated with respect to certain embodiments which give satisfactory results, it will be understood by those skilled in the art that various other changes and modifications may be made without departing from the spirit and scope of the invention, and it is, therefore, intended in the appended claims to cover all such changes and modifications.

What is claimed is:

1. A body sensing device, comprising:
   an oscillator having a coil, said oscillator configured to stop an oscillation of a high frequency signal when a body to be detected thereby exists near said coil, and
   a controller configured to detect the stop of the oscillation of said oscillator,
   wherein said high frequency has such a frequency that said oscillator stops the oscillation in response to an approach by a non-magnetic body or a non-metal body, and
   wherein said coil is configured to output a signal having a quality factor below a predetermined value when said non-magnetic body or said non-metal body approaches said coil, and to output the signal having a quality factor above the predetermined value when a magnetic body, a metal body or no object approaches said coil.

2. A body sensing device according to claim 1, wherein said frequency is between 10 MHz and 300 MHz.

3. A body sensing device according to claim 1, wherein said coil has a diameter of between 150 mm and 300 mm.

4. A body sensing device according to claim 1, wherein said coil is an air-core coil having at least one turn.

5. A body sensing device according to claim 1, wherein said coil is wound around a magnetic member.

6. A body sensing device according to claim 1, wherein said coil includes a plurality of coils disposed in a concentric relationship to one another.

7. A living body sensing device, comprising:
   a coil for sensing a living body,
   a discriminating circuit connected with said coil for discriminating an approach of said living body,
   a circuit housing enclosing said discriminating circuit,
   wherein a size of said coil in any horizontal direction is larger than a size of said circuit housing in any horizontal direction, and
   wherein said coil is configured to output a signal having a quality factor above a predetermined value when a magnetic body or no object approaches said coil, and to output a signal having a quality factor below the predetermined value when said living body approaches said coil.

8. A living body sensing device according to claim 7, wherein said coil is a one-turn coil having a diameter of approximately 200 mm.

9. A living body sensing device according to claim 8, wherein said coil is built within one of a seat and a cushion.

10. A living body sensing device according to claim 8, wherein said coil is made of conductive material in a high frequency.

11. A living body sensing device according to claim 8, wherein said coil is a circular air-core coil having a diameter between 15 centimeters and 30 centimeters.

12. A living body sensing device according to claim 7, wherein said discriminating circuit includes an oscillator for stopping an oscillation of a high frequency signal as the living body to be detected thereby exists near said coil, and a controller for detecting the stop of the oscillation of said oscillator.

13. A living body sensing device according to claim 12, wherein said oscillator is provided with a sensitivity adjuster for changing the quality factor of said coil.

14. A living body sensing device according to claim 12, wherein said oscillator is provided with a temperature compensation circuit for compensating a change of an amplitude or frequency of said high frequency signal due to a temperature change.

15. A living body sensing device, comprising:

an oscillator including a coil, said oscillator generating a high frequency signal having a different amplitude depending upon whether or not a living body exists near said coil, the amplitude of the high frequency signal being generated based on an output signal of said coil, the output signal of said coil having a quality factor below a predetermined value when the living body exists near said coil, and having a quality factor above the predetermined value when the living body does not exist near said coil, a detector for detecting an output signal generated from said oscillator, and a controller for discriminating an existence or absence of the living body in accordance with a magnitude of an output signal generated from said detector.

16. A living body sensing device according to claim 15, further comprising a series circuit of a filter and an amplifier which is connected with said detector in parallel, wherein a signal having a frequency higher than that of the high frequency signal upon the existence and absence of the living body near said coil is detected by said filter to be amplified by said amplifier, and wherein an amplitude of the output signal generated from said detector is compensated by an output from said amplifier.

17. A living body sensing device according to claim 15, further comprising a second amplifier connected to said filter and interposed between said detector and said controller, said second amplifier for detecting a frequency of the output signal from said detector, wherein an amplification factor of said second amplifier is changed according to the frequency detected by said filter.

18. A living body sensing device according to claim 15, wherein said oscillator includes only one resonator for generating the high frequency signal.

19. A living body sensing device, comprising:

an oscillator including a coil, said oscillator generating a high frequency signal having a different amplitude depending upon whether or not a living body exists near said coil, a detector for detecting an output signal generated from said oscillator to generate a detection signal, a controller for discriminating an existence or absence of the living body in accordance with a magnitude of the output signal generated from said detector, and a frequency detector for detecting an output frequency of said oscillator, wherein said controller determines the absence of the living body regardless of an amplitude of said detection signal when the output frequency detected by said frequency detector is higher than a predetermined frequency which sets a maximum frequency in which the detection of the living body is made.

20. A living body sensing device according to claim 19, wherein the absence or presence of the living body is determined based on both an amplitude of a signal output from said coil and a frequency of the signal output from said coil, wherein the amplitude of the signal being less than a predetermined level is indicative of the presence of the living body, and the frequency of the signal being less than the predetermined frequency is also indicative of the presence of the living body, and wherein, when the amplitude of the signal is less than the predetermined level at the same time the frequency of the signal is greater than the predetermined frequency, the absence of the living body is determined by said controller.

* * * * *